May 3, 1960 M. BERNSTEIN 2,935,610

FREQUENCY RESPONSIVE CIRCUITS

Filed Jan. 28, 1958

INVENTOR,
MARVIN BERNSTEIN

BY Harry M. Saragovitz
ATTORNEY.

United States Patent Office 2,935,610
Patented May 3, 1960

2,935,610

FREQUENCY RESPONSIVE CIRCUITS

Marvin Bernstein, Eatontown, N.J., assignor to the United States of America as represented by the Secretary of the Army Application January 28, 1958, Serial No. 711,759

1 Claim. (Cl. 250—27)

(Granted under Title 35, U.S. Code (1952), sec. 266)

The invention described herein may be manufactured and used by or for the Government for governmental purposes, without the payment of any royalty thereon.

The invention relates generally to frequency responsive circuits, and particularly to frequency-shift systems utilizing such circuits.

In frequency-shift signaling, the carrier frequency at the transmitter is shifted between two discrete frequencies, one being the mark frequency and the other being the space frequency. At the receiver, circuits are provided which will discriminate between the two frequencies.

It is desirable to provide as narrow a separation between the two frequencies as is permitted by the intelligence to be transmitted. In the past, where such separation has been small, it has been necessary to heterodyne the incoming carrier in several steps to bring the carrier into the audio frequency region, in order to increase the separation percentage and thus permit adequate separation of the two frequencies by means of filters. However, such audio frequency filters are bulky and expensive, and are not readily adjustable. In addition, heterodyning to such low frequencies requires a greater number of heterodyne steps and much higher local oscillator stability.

It is an object of the invention herein to provide frequency responsive circuits that are relatively small and inexpensive, and yet provide adequate discrimination for small frequency shifts at higher mean frequencies. It is a further object of the invention to provide circuits of this type having a relatively narrow band pass, the center frequency of which is readily adjustable.

The features of my invention which I believe to be novel are set forth with particularity in the appended claim. My invention itself, however, both as to its organization and method of operation, together with further objects and advantages thereof, may best be understood by reference to the following description taken in conjunction with the accompanying drawing, in which:

Figure 1:
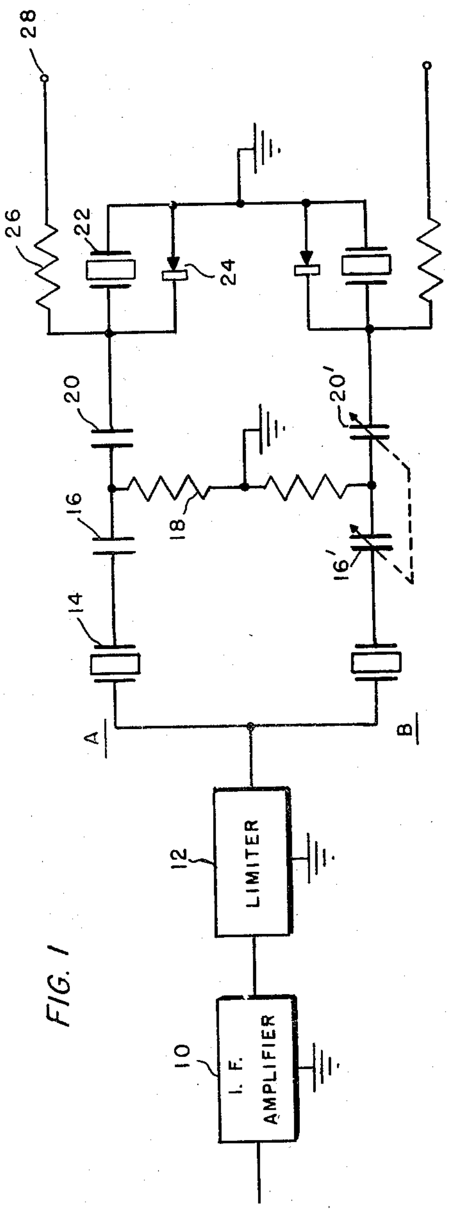
Figure 1 is a schematic circuit diagram of the invention.

Figure 1 shows a portion of a receiver for a frequency shift telegraph system. By means well known in the art, the incoming carrier is shifted downward, by heterodyning in one or more steps, to a relatively high intermediate frequency for example 5.4 megacycles. The frequency is amplified by an intermediate frequency amplifier 10, and then limited in amplitude in a limiter 12.

The output of the limiter is passed through two filter channels A and B connected in parallel across the limiter output. The two channels are identical in function and substantially identical in structure, with the exception that one is responsive to a narrow band including the mark frequency signal while the other channel is responsive to a narrow band including the space frequency signal, said bands being non-overlapping. The center frequency of the band pass of one or both channels may be made adjustable to accommodate the receiver to variations in the separation of the mark and space frequencies.

Channel A comprises a pair of crystal filters tuned to the same frequency and connected in cascade to provide a relatively narrow band pass. One of the filters comprises a piezoelectric crystal 14 connected in series with a capacitor 16 and a load resistor 18 across the output of limiter 12. The response frequency of this filter is dependent upon the resonant frequency of the crystal and the capacity of capacitor 16.

The output of this filter, which appears across resistor 18, is applied to a second filter tuned to the same frequency and comprising a capacitor 20 and piezoelectric crystal 22. The second filter serves to narrow the band pass of the channel and hence to sharpen the response to the desired frequency.

The output of crystal 22 is rectified by a diode 24 and is applied through a high resistance decoupling resistor 26 to an output terminal 28. The voltage between terminal 28 and ground may be applied to a current amplifier and then to a suitable recording device.

As above pointed out the structure of channel B is substantially identical to that of channel A. The sole difference is that condensers 16′ and 20′ are made variable so that the center frequency of the band pass of the filters can be varied. Condensers 16′ and 20′ are tied together for unicontrol so that they can be simultaneously varied until the center frequency of the filters is exactly tuned to the desired frequency. In this way the system can be adjusted to respond to signals having different mark and space frequency separations. If a greater range of adjustment is desired, the capacitors in both channels can be made adjustable.

Figure 2:
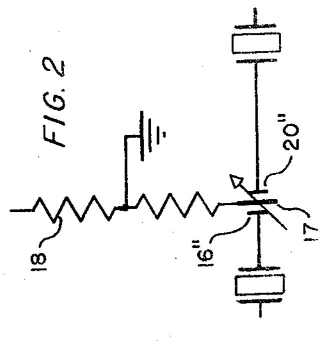
Figure 2 is a partial schematic circuit diagram of a modification of the invention.

It will be noted that in both channels A and B the order of arrangement of the crystal and capacitor 16 of the first filter is opposite to that of the capacitor and crystal of the second filter. This provides a common connection for both capacitors so that a common rotor can be used for both capacitors. This is illustrated in Figure 2, wherein 16″ is the stator of the first filter, 20″ is the stator of the second filter, and 17 is the common rotor.

In one system incorporating the invention, the intermediate frequency was in the 4.3 megacycle region, the separation between the mark and space frequencies was 850 cycles, and the band pass of the crystals was 100 cycles. Because of this relatively narrow band width, noise signals of a frequency outside the band pass of the filters are substantially reduced or eliminated.

While there have been described what is at present considered a preferred embodiment of the invention, it will be obvious to those skilled in the art that various changes and modifications may be made therein without departing from the invention; and it is aimed in the appended claim to cover all such changes and modifications as fall within the true spirit and scope of the invention.

What is claimed is:

In combination with a source of frequency-shifted carrier signals, a pair of detector channels connected to said source and respectively tuned to different frequencies, said channels having nonoverlapping pass bands, each of said channels comprising a pair of filters tuned to the same frequency and connected in cascade to said source, the first of said filters comprising a piezoelectric crystal, a first capacitor, and a resistor connected in series to said source in the order named, the second of said filters comprising a second capacitor and a second piezoelectric crystal connected in series across said resistor in the order named, said second capacitor having one terminal connected to the junction of said resistor and said first capacitor, said capacitors being variable and ganged for unicontrol, and a rectifier connected across said second crystal for detecting the output of said channel.

References Cited in the file of this patent

UNITED STATES PATENTS

| | | |
|---|---|---|
| 1,742,252 | Holden | Jan. 7, 1930 |
| 2,114,335 | Crosby | Apr. 19, 1938 |
| 2,165,509 | Ring et al. | July 11, 1939 |
| 2,397,841 | Crosby | Apr. 2, 1946 |
| 2,686,871 | Reichs | Aug. 17, 1954 |